United States Patent
Yu et al.

(10) Patent No.: US 12,066,721 B2
(45) Date of Patent: Aug. 20, 2024

(54) DISPLAY PANEL AND DISPLAY DEVICE

(71) Applicant: WUHAN CHINA STAR OPTOELECTRONICS TECHNOLOGY CO., LTD., Wuhan (CN)

(72) Inventors: Wenqiang Yu, Wuhan (CN); Chao Wang, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 710 days.

(21) Appl. No.: 17/281,947

(22) PCT Filed: Mar. 24, 2021

(86) PCT No.: PCT/CN2021/082521
§ 371 (c)(1),
(2) Date: Mar. 31, 2021

(87) PCT Pub. No.: WO2022/165942
PCT Pub. Date: Aug. 11, 2022

(65) Prior Publication Data
US 2023/0109190 A1    Apr. 6, 2023

(30) Foreign Application Priority Data
Feb. 5, 2021 (CN) .......................... 202110264149.3

(51) Int. Cl.
*G02F 1/1362* (2006.01)
*G02F 1/1343* (2006.01)
(Continued)

(52) U.S. Cl.
CPC .. *G02F 1/134345* (2021.01); *G02F 1/136209* (2013.01); *G02F 1/136222* (2021.01);
(Continued)

(58) Field of Classification Search
CPC ......... G02F 1/134345; G02F 1/136222; G02F 1/136286
See application file for complete search history.

(56) References Cited

U.S. PATENT DOCUMENTS

2009/0315921 A1* 12/2009 Sakaigawa ........... G09G 3/3413
345/694
2016/0155777 A1* 6/2016 Kabe ..................... G09G 3/32
257/89
2020/0279517 A1* 9/2020 Huang .................. H10K 59/00

FOREIGN PATENT DOCUMENTS

CN        104637439 A    5/2015
CN        104779262 A    7/2015
(Continued)

OTHER PUBLICATIONS

International Search Report in International application No. PCT/CN2021/082521, mailed on Oct. 28, 2021.
(Continued)

*Primary Examiner* — Douglas M Menz
(74) *Attorney, Agent, or Firm* — PV IP PC; Wei Te Chung; Zhigang Ma

(57) ABSTRACT

A display panel and a display device are provided. The display panel includes a plurality of scan lines extending in a first direction, a plurality of data lines extending in a second direction, and a plurality of pixel units. Each of the pixel units comprises a first sub-pixel, a second sub-pixel, and a third sub-pixel disposed between adjacent two of the scan lines. The first sub-pixel and the second sub-pixel are arranged along the first direction, and the first sub-pixel and the third sub-pixel are arranged along the second direction.

18 Claims, 7 Drawing Sheets

(51) Int. Cl.
     *G02F 1/1368*     (2006.01)
     *H01L 27/12*      (2006.01)
     *H01L 29/786*     (2006.01)

(52) U.S. Cl.
     CPC ...... *G02F 1/136286* (2013.01); *G02F 1/1368* (2013.01); *H01L 27/124* (2013.01); *H01L 29/78633* (2013.01); *G02F 2201/40* (2013.01)

(56) References Cited

FOREIGN PATENT DOCUMENTS

| | | |
|---|---|---|
| CN | 205194239 U | 4/2016 |
| CN | 107680990 A | 2/2018 |
| CN | 111243497 A | 6/2020 |
| CN | 214278585 U | 9/2021 |
| JP | 2010186582 A | 8/2010 |

OTHER PUBLICATIONS

Written Opinion of the International Search Authority in International application No. PCT/CN2021/082521, mailed on Oct. 28, 2021.

\* cited by examiner

DISPLAY PANEL AND DISPLAY DEVICE

CROSS REFERENCE TO RELATED APPLICATIONS

This application is a Notional Phase of PCT Patent Application No. PCT/CN2021/082521 having international filing date of Mar. 24, 2021, which claims the benefit of priority of Chinese Patent Application No. 202110164149.3, filed on Feb. 5, 2021, with the Chinese Patent Office, entitled "Display Panel and Display Device", the contents of which are incorporated herein by reference in their entirety.

FIELD OF INVENTION

This disclosure relates to a field of display technology, and more particularly, to a display panel and a display device.

BACKGROUND OF INVENTION

Virtual reality (VR) and augmented reality (AR) technologies have been applied in military and aviation fields. The development of display technology will drive the progress of VR technology and AR technology. The improvement of resolution and viewing angle field of a display device is the long-term development direction of display technology, and pixel density (pixel per inch, PPI) is an important factor that determines the resolution and viewing angle of the display device.

Liquid crystal display technology is widely used in VR equipment. At present, the pixel density displayed by commercially available VR devices is about 1000, which cannot be further improved. This is mainly limited by the manufacturing process capability of the LCD panel. Sub-pixels in a single pixel unit of a liquid crystal display panel are arranged side by side. Therefore, even if the width of a single sub-pixel is designed according to the extreme capacity of the manufacturing process, the pixel density of the liquid crystal display panel cannot be significantly improved.

SUMMARY OF INVENTION

Technical Problem

At present, pixel densities of conventional display panels are limited by manufacturing process capability, and have difficulty in further improvement.

Technical Solutions

In order to solve the above-mentioned drawback, the disclosure provides a technical solution as follow.

The disclosure provides a display panel. The display panel comprises: a plurality of scan lines extending in a first direction, a plurality of data lines extending in a second direction, and a plurality of pixel units, wherein each of the pixel units comprises a first sub-pixel, a second sub-pixel and a third sub-pixel disposed between adjacent two of the scan lines;

wherein the first sub-pixel and the second sub-pixel are arranged along the first direction, and the first sub-pixel and the third sub-pixel are arranged along the second direction.

In the display panel of the disclosure, each of the pixel units further comprises a first region disposed between adjacent two of the adjacent scan lines, the first region and the second sub-pixel are arranged along the second direction, and the first region and the third sub-pixels are arranged along the first direction.

In the display panel of the disclosure, the first sub-pixel comprises a first pixel electrode, the second sub-pixel comprises a second pixel electrode, and the third sub-pixel comprises a third pixel electrode, and each of the pixel units comprises a third transistor, a first end of the third transistor is electrically connected to the data line, and a second end of the third transistor is electrically connected to one of the first pixel electrode, the second pixel electrode, and the third pixel electrode through a third connection hole, and the third connection hole is defined in the first region.

In the display panel of the disclosure, the second end of the third transistor is electrically connected to the third pixel electrode through the third connection hole.

In the display panel of the disclosure, each of the pixel units further comprises a first transistor and a second transistor, a second end of the first transistor is electrically connected to the first pixel electrode through a first connection hole, and a second end of the second transistor is electrically connected to the second pixel electrode through a second connection hole.

In the display panel of the disclosure, the first transistor, the second transistor, and the third transistor are arranged along a first scan line. The first connection hole and the second connection hole are defined on a first side of the first scan line, and the third connection hole is defined on a second side of the first scan line opposite to the first side of the first scan line.

In the display panel of the disclosure, the first transistor comprises a gate, and the gate of the first transistor is electrically connected to the first scan line. The second transistor comprises a gate, and the gate of the second transistor is electrically connected to the first scan line, and the third transistor comprises a gate, and the gate of the third transistor is electrically connected to the first scan line.

In the display panel of the disclosure, the display panel further comprises a second scan line adjacent to the first scan line, and the first sub-pixel, the second sub-pixel and the third sub-pixel are all disposed between the first scan line and the second scan line.

In the display panel of the disclosure, the third transistor is disposed between the first transistor and the second transistor.

In the display panel of the disclosure, a first end of the first transistor is electrically connected to a first data line through a fourth connection hole, the first end of the third transistor is electrically connected to a second data line through the sixth connection hole, and a first end of the second transistor is electrically connected to the third data line through a fifth connection hole, the fourth connection hole and the fifth connection hole are defined on the second side of the first scan line, and the sixth connection hole is defined on the first side of the first scan line.

In the display panel of the disclosure, the second transistor is disposed between the first transistor and the third transistor.

In the display panel of the disclosure, a first end of the first transistor is electrically connected to a first data line through a fourth connection hole, a first end of the second transistor is electrically connected to a second data line through a fifth connection hole, and the first end of the third transistor is electrically connected to a third data line through a sixth connection hole, the fourth connection hole and the fifth connection hole are defined on the second side of the first scan line, and the sixth connection hole is defined on the first side of the first scan line.

In the display panel of the disclosure, the first sub-pixel comprises a first color resistance unit, the second sub-pixel comprises a second color resistance unit, and the third sub-pixel comprises a third color resistance unit, each of the pixel units comprises a first data line, a second data line and a third data line, and the first color resistance unit and the third color resistance unit are disposed between the first data line and the second data line, and the second color resistance unit is disposed between the second data line and the third data line.

In the display panel of the disclosure, the first region is disposed between the second data line and the third data line.

In the display panel of the disclosure, a first light shielding layer is disposed between the first sub-pixel and the third sub-pixel.

In the display panel of the disclosure, one side of the first light shielding layer is connected to the first color resistance unit, and the other side of the first light shielding layer is connected to the third color resistance unit.

In the display panel of the disclosure, the plurality of pixel units comprises a first pixel unit and a second pixel unit, the first pixel unit and the second pixel unit are arranged along the second direction, and a second light shielding layer is disposed between the first pixel unit and the second pixel unit.

In the display panel of the disclosure, the second light shielding layer shields the first transistor, the second transistor, and the third transistor.

The disclosure further provides a display device comprising a display panel as mentioned above The disclosure further provides a display device. The display device comprises a display panel. The display panel comprises a plurality of scan lines extending in a first direction, a plurality of data lines extending in a second direction, and a plurality of pixel units. Each of the pixel units comprises a first sub-pixel, a second sub-pixel, a third sub-pixel, and a first region disposed between adjacent two of the scan lines.

The first sub-pixel and the second sub-pixel are arranged along the first direction.

The first sub-pixel and the third sub-pixel are arranged along the second direction.

The first region and the second sub-pixel are arranged along the second direction.

The first region and the third sub-pixel are arranged along the first direction.

The third sub-pixel comprises a third pixel electrode, each of the pixel units further comprises a third transistor, a second end of the third transistor is electrically connected to the third pixel electrode through a third connection hole, and the third connection hole is defined in the first region.

Beneficial Effects

The present disclosure provides a display panel and a display device. By arranging a plurality of sub-pixels in each pixel unit along two different directions, the number of the sub-pixels arranged in one of the directions is reduced. It is advantageous to reduce the width of each pixel unit and to improve the pixel density of the display panel without changing the manufacturing process. Moreover, as the number of the sub-pixels arranged in one direction is reduced, the width of the entire pixel unit can be reduced while the width of a single sub-pixel is increased, which is beneficial to reduce the requirements for the panel manufacturing capability, improve the yield of the panel, and reduce the costs. In addition, in this disclosure, a position for defining a connection hole between the thin film transistor and the pixel electrode in the pixel unit is adjusted, and at least one connection hole is defined in the first region. This is beneficial to increase the aperture ratio of the display panel.

DESCRIPTION OF DRAWINGS

In order to more clearly illustrate the embodiments of the disclosure or the technical solutions in the prior art, the following briefly introduces the accompanying drawings used in the embodiments. Obviously, the drawings in the following description merely show some of the embodiments of the disclosure. As regards one of ordinary skill in the art, other drawings can be obtained in accordance with these accompanying drawings without making creative efforts.

DETAILED DESCRIPTION OF PREFERRED EMBODIMENTS

Figure 1:
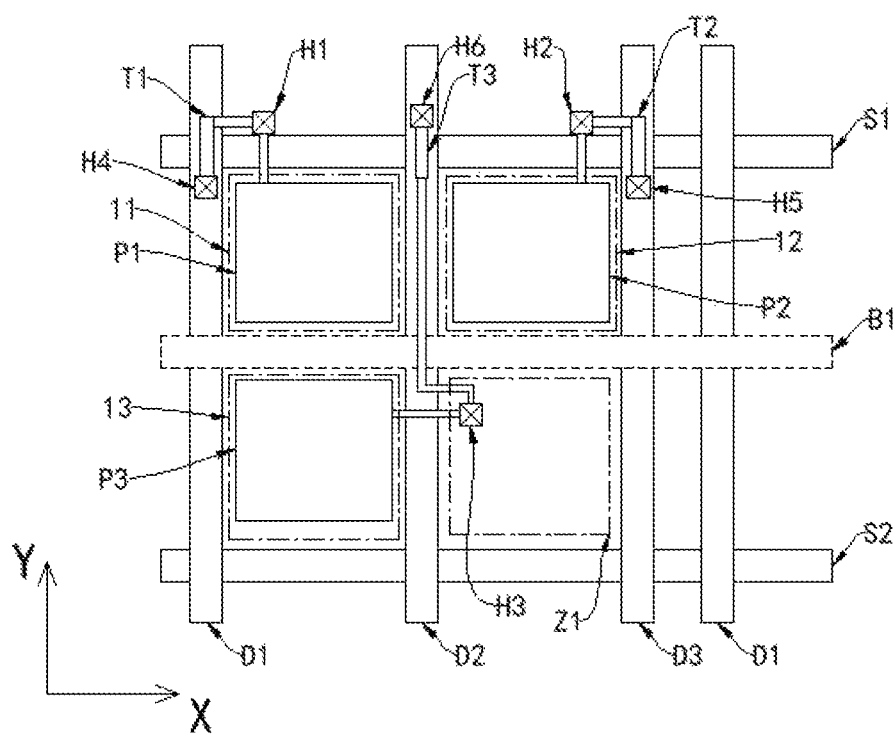
FIG. 1 is a schematic diagram of a first perspective structure of a display panel according to a first embodiment of the disclosure.

This description of the exemplary embodiments is intended to be read in connection with the accompanying drawings, which are to be considered part of the entire written description. In the description, terms such as "upper", "lower", "front", "back", "left", "right", "inside", "outside", and "side", as well as derivatives thereof, should be construed to refer to the orientation as then described or as shown in the drawing under discussion. These terms are for convenience of description and do not require that the apparatus be constructed or operated in a particular orientation, and do not limit the scope of the disclosure. Referring to the drawings of the disclosure, similar components are labeled with the same number.

An embodiment of the disclosure provides a display panel. The display panel comprises a plurality of scan lines extending in a first direction, a plurality of data lines extending in a second direction, and a plurality of pixel units. Each of the pixel units comprises a first sub-pixel, a second sub-pixel, and a third sub-pixel disposed between adjacent two of the scan lines. The first sub-pixel and the second sub-pixel are arranged along the first direction, and the first sub-pixel and the third sub-pixel are arranged along the second direction. Compared with the design of arranging a plurality of sub-pixels in a single direction, the plurality of sub-pixels in each pixel unit arranged along two different directions in one embodiment of the disclosure are advantageous to reduce the width of each pixel unit and to improve the pixel density of the display panel without changing the manufacturing process. Moreover, as the number of the sub-pixels arranged in one direction is reduced, the width of the entire pixel unit can be reduced while the width of a single sub-pixel is increased, which is beneficial to reduce the requirements for the panel manufacturing capability, improve the yield of the panel, and reduce the costs.

Figure 2:
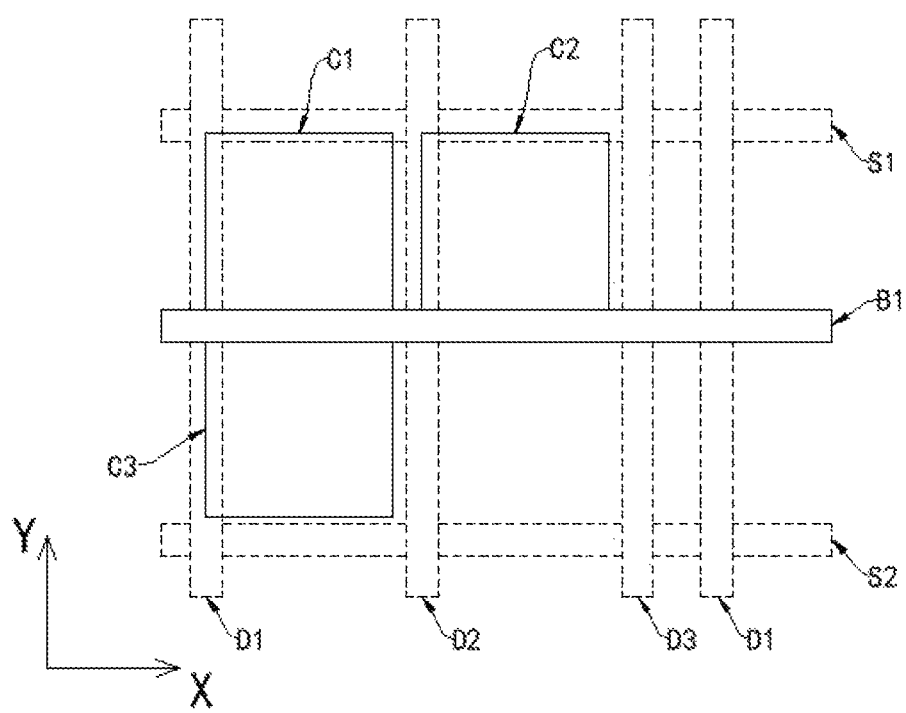
FIG. 2 is a schematic diagram of a second perspective structure of the display panel according to the first embodiment of the disclosure.

In one embodiment of the disclosure, referring to FIG. 1 and FIG. 2, a schematic diagram of a first perspective structure of a display panel according to a first embodiment of the disclosure is shown in FIG. 1, and a schematic diagram of a second perspective structure of the display panel according to the first embodiment of the disclosure is shown in FIG. 2. It should be noted that the first perspective structure shown in FIG. 1 depicts the relative configuration of the thin film transistor, data line, scan line, pixel electrode and other elements of the display panel. The second perspective structure shown in FIG. 2 depicts the relative position of the elements such as the color resistance unit and the light shielding layer of the display panel.

The display panel comprises a plurality of pixel units which are disposed in the display panel in an array. It should be noted that the pixel units are the smallest repeating units in the display panel, and the display function of the display panel is realized by the cooperative light emission of the plurality of pixel units. Each of the pixel units is a partial region on the display panel. A backlight unit, a data line, a scan line, a thin film transistor, a pixel electrode, a liquid crystal, a color resistance unit, etc. required for realizing the light emission of the pixel unit are disposed in the partial region.

Each of the pixel units includes a first sub-pixel 11, a second sub-pixel 12, and a third sub-pixel 13 disposed between adjacent two of the scan lines (for example, a first scan line S1 and a second scan line S2 in FIG. 1). The first sub-pixel 11 includes a first color resistance unit C1. The first color resistance unit C1 is one of a red color resistance, a green color resistance, and a blue color resistance. The first color resistance unit C1 is configured for realizing the color light emission of the first sub-pixel 11. The second sub-pixel 12 includes a second color resistance unit C2, and the second color resistance unit C2 is one of a red color resistance, a green color resistance, and a blue color resistance. The second color resistance unit C2 is different from the first color resistance unit C1, and the second color resistance unit C2 is configured realize the color light emission of the second sub-pixel 12. The third sub-pixel 13 includes a third color resistance unit C3, and the third color resistance unit C3 is one of a red color resistance, a green color resistance, and a blue color resistance. The third color resistance unit C3 is different from the first color resistance unit C1 and the second color resistance unit C2, and the third color resistance unit C3 is configured to realize the color light emission of the third sub-pixel 13.

In each of the pixel units, the first sub-pixel 11 and the second sub-pixel 12 are arranged along the first direction X, and the first sub-pixel 11 and the third sub-pixel 13 are arranged along the second direction Y. Optionally, the first direction X and the second direction Y are two directions perpendicular to each other. It should be noted that the configuration that "the first sub-pixel 11 and the second sub-pixel 12 are arranged along the first direction X" does not limit the sequence of the first sub-pixel 11 and the second sub-pixel 12 arranged along the first direction X. The first sub-pixel 11 and the second sub-pixel 12 are arranged in sequence along the first direction X, or the second sub-pixel 12 and the first sub-pixel 11 are arranged in sequence along the first direction X. The configuration that "the first sub-pixel 11 and the third sub-pixel 13 are arranged along the second direction Y" are similar, which is not redundantly described herein.

In this embodiment, by arranging the first sub-pixel 11 and the second sub-pixel 12 along the first direction X, and arranging the first sub-pixel 11 and the third sub-pixel 13 along the second direction Y different from the first direction X, the number of sub-pixels arranged along the first direction X in the pixel unit is reduced. It is advantageous to reduce the width of each pixel unit along the first direction X and to improve the arrangement of pixel density of the display panel without changing the manufacturing process.

In addition, the conventional display panel is limited by the manufacturing process capability. For example, the width of the sub-pixels in each pixel unit in the first direction X has a width limit in the manufacturing process. Under the condition of the width limit, the requirements for the display panel manufacturing process equipment are high, which will result in high manufacturing costs and poor yields of the display panel. In this embodiment, the sub-pixels in each pixel unit are arranged in two different directions. Compared with the conventional technology, the number of sub-pixels arranged along the first direction X is reduced, which can increase the width of a single sub-pixel and reduce the width of each sub-pixel, and can not only increase the width of a single sub-pixel, but also reduce the width of each pixel unit. It is advantageous in reducing the requirements for the display panel manufacturing process capability, improving the yield of the display panel, reducing the cost, and realizing the arrangement of high pixel density of the display panel.

Furthermore, the display panel further includes a plurality of scan lines extending in the first direction X and a plurality of data lines extending in the second direction Y. The data line and the scan line are arranged alternately. The data line is configured for providing the data signal, and the scan line is configured for providing the scan signal. The data lines comprise a first data line D1, a second data line D2, and a third data line D3 that are sequentially adjacent, and the scan lines comprise a first scan line S1 and a second scan line S2 that are adjacent to each other. The first sub-pixel 11, the second sub-pixel 12, and the third sub-pixel 13 are all disposed between the first scan line S1 and the second scan line S2. The first sub-pixel 11 and the third sub-pixel 13 are both disposed between the first data line D1 and the second data line D2, and the second sub-pixel 12 is disposed between the second data line D2 and the third data line D3.

Furthermore, the first color resistance unit C1, the second color resistance unit C2, and the third color resistance unit C3 are all disposed between the first scan line S1 and the second scan line S2, the first color resistance unit C1 and the third color resistance unit C3 are both disposed between the first data line D1 and the second data line D2, and the second color resistance unit C2 is disposed between the second data line D2 and the third data line D3.

The first sub-pixel 11 comprises a first pixel electrode P1, and the first pixel electrode P1 is correspondingly arranged with the first color resistance unit C1. The second sub-pixel 12 comprises a second pixel electrode P2, and the second pixel electrode P2 is arranged corresponding to the second color resistance unit C2. The third sub-pixel 13 comprises a third pixel electrode P3, and the third pixel electrode P3 is arranged corresponding to the third color resist unit C3.

The pixel unit further includes a first region Z1 disposed between the first scan line S1 and the second scan line S2, the first region Z1 and the second sub-pixel 12 are arranged along the second direction Y, and the first region Z1 and the third sub-pixel 13 are arranged along the first direction X.

Furthermore, the first region Z1 is disposed between the second data line D2 and the third data line D3.

Each of the pixel units comprises a third transistor T3, a first end of the third transistor T3 is electrically connected to the data line, and a second end of the third transistor T3 is electrically connected to one of the first pixel electrode 11, the second pixel electrode 12, and the third pixel electrode 13 through a third connection hole H3, and the third connection hole H3 is defined in the first region Z1.

Specifically, the first end of the third transistor T3 is electrically connected to the data line through a sixth connection hole H6, and the second end of the third transistor T3 is electrically connected to the third pixel electrode 13 through the third connection hole H3.

Each of the pixel units further includes a first transistor T1 and a second transistor T2. A first end of the first transistor T1 is electrically connected to the data line through a fourth connection hole H4, and a second end of the first transistor T1 is electrically connected to the first pixel electrode 11 through the first connecting hole H1. A first end of the second transistor T2 is electrically connected to the data line through a fifth connection hole H5, and a second end of the second transistor T2 is electrically connected to the second pixel electrode 12 through a second connection hole H2.

Optionally, the first end and the second end of the first transistor T1 are respectively the source and the drain of the first transistor T1. The first transistor T1 further comprises a gate, and the gate of the first transistor T1 is electrically connected to the first scan line S1. The first end and the second end of the second transistor T2 are the source and the drain of the second transistor T2, respectively. The second transistor T2 further comprises a gate, and the gate of the second transistor T2 is electrically connected to the first scan line S1. The first end and the second end of the third transistor T3 are the source and the drain of the third transistor T3, respectively. The third transistor T3 further comprises a gate, and the gate of the third transistor T3 is electrically connected to the first scan line S1.

Moreover, the first transistor T1, the second transistor T2, and the third transistor T3 are arranged along the first scan line S1, and the third transistor T3 is disposed between the first transistor T1 and the second transistor T2.

The first end of the first transistor T1 is electrically connected to the first data line D1 through the fourth connection hole H4, and the first end of the third transistor T3 is electrically connected to the second data line D2 through the sixth connecting hole H6. The first end of the second transistor T2 is electrically connected to the third data line D3 through the fifth connection hole H5.

Furthermore, the first scan line S1 comprises a first side and a second side opposite to the first side. The first connection hole H1 and the second connection hole H2 are defined on the first side of the first scan line S1, and the third connection hole H3 is defined on the second side of the first scan line S1. The fourth connection hole H4 and the fifth connection hole H5 are defined on the second side of the first scan line S1, and the sixth connection hole H6 is defined on the first side of the first scan line S1.

Furthermore, the display panel further comprises a first light shielding layer B1 arranged between the first sub-pixel 11 and the third sub-pixel 13. One side of the first light shielding layer B1 is connected to the first color resistance unit C1, and the other side of the first light shielding layer B1 is connected to the third color resistance unit C3. The first light shielding layer B1 is configured to shield part of the light emitted by the first sub-pixel 11 and part of the light emitted by the third sub-pixel 13 to prevent the color mixing problem of the first sub-pixel 11 and the third sub-pixel 13.

Figure 3:
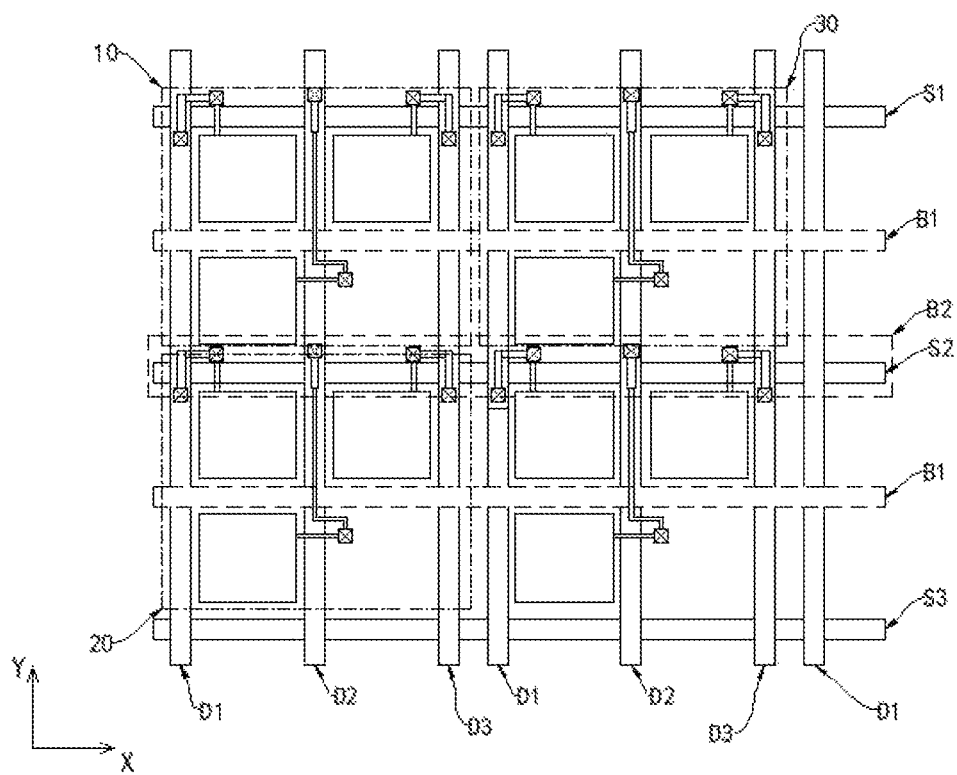
FIG. 3 is a structural schematic diagram of the display panel comprising a plurality of pixel units according to the first embodiment of the disclosure.

Referring to FIG. 1 to FIG. 3, a structural schematic diagram of the display panel comprising a plurality of pixel units according to the first embodiment of the disclosure is shown in FIG. 3. The display panel includes a first pixel unit 10 and a second pixel unit 20 arranged adjacently along the second direction Y. A second light shielding layer B2 is disposed between the first pixel unit 10 and the second pixel unit 20. The second light shielding layer B2 is configured to shield part of the light emitted by the first pixel unit 10 and part of the light emitted by the second pixel unit 20, and prevent the color mixing problem of the first pixel unit 10 and the second pixel unit 20.

Furthermore, the display panel further comprises the first pixel unit 10 and a third pixel unit 30 arranged adjacently along the first direction X. The third data line D3 electrically connected to the first pixel unit 10 is adjacent to the first data line D1 electrically connected to the third pixel unit 30, and there is no sub-pixel between them.

It should be noted that FIG. 3 shows the first scan line S1, the second scan line S2, and the third scan line S3 that are arranged adjacent to each other in the second direction Y. With respect to the second pixel unit 20, the second scan line S2 and the third scan line S3 are respectively equivalent to the first scan line and the second scan line of the second pixel unit 20, so as to comply with the description of the above embodiment of the disclosure.

Furthermore, the first transistor T1, the second transistor T2 and the third transistor T3 are all disposed between the first pixel unit 10 and the second pixel unit 20. The second light shielding layer B2 is further configured to shield the first transistor T1, the second transistor T2, and the third transistor T3 to prevent the metal structure in each thin film transistor from affecting the display effect of the display panel due to light reflection.

Optionally, each of the first light shielding layer B1 and the second light shielding layer B2 comprises a strip structure extending along the first direction X, and the display panel includes a plurality of the first light shielding layer B1 and a plurality of the second light shielding layers B2.

As mentioned above, in this embodiment, by arranging a plurality of sub-pixels in each pixel unit along two different directions, the number of the sub-pixels arranged in one of the directions is reduced. It is advantageous to reduce the width of each pixel unit and to improve the pixel density of the display panel without changing the manufacturing process. Moreover, as the number of the sub-pixels arranged in one direction is reduced, the width of the entire pixel unit can be reduced while the width of a single sub-pixel is increased, which is beneficial to reduce the requirements for the display panel manufacturing capability, improve the yield of the display panel, and reduce the costs. In this disclosure, a position for defining a connection hole between the thin film transistor and the pixel electrode in the pixel unit is adjusted, and at least one connection hole is defined in the first region. This is beneficial to increase the aperture ratio of the display panel.

Figure 4:
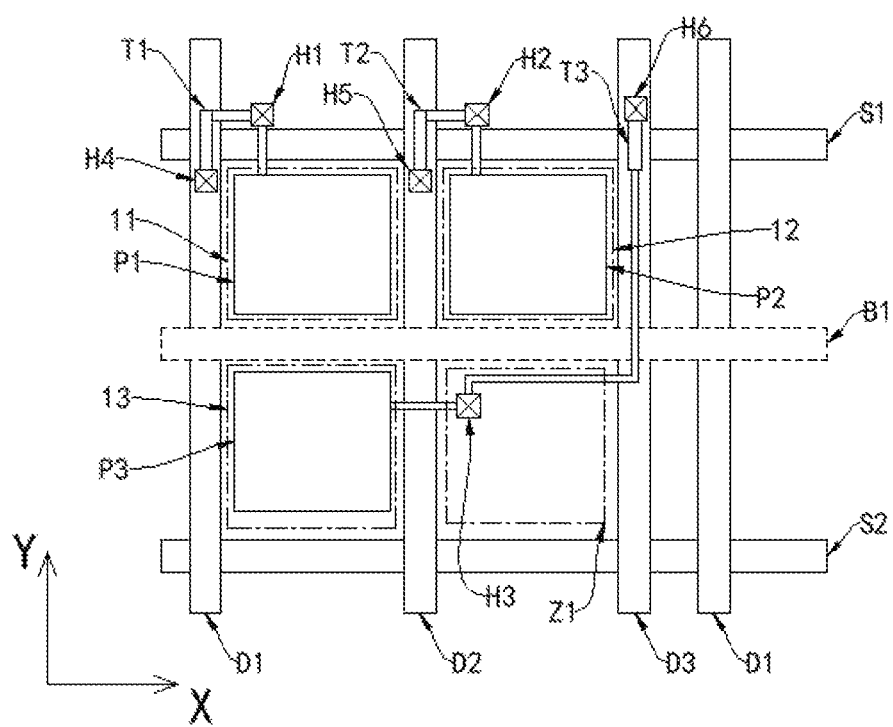
FIG. 4 is a schematic diagram of a first perspective structure of a display panel according to a second embodiment of the disclosure.
Figure 5:
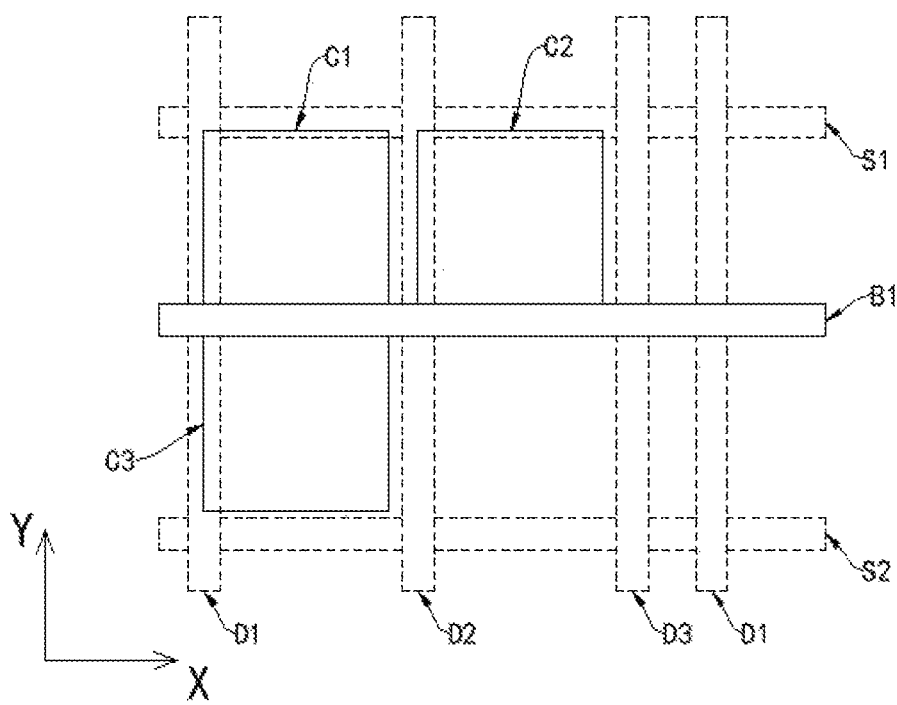
FIG. 5 is a schematic diagram of a second perspective structure of the display panel according to the second embodiment of the disclosure.

In one embodiment of the disclosure, referring to FIG. 4 and FIG. 5, a schematic diagram of a first perspective structure of a display panel according to a second embodiment of the disclosure is shown in FIG. 4, and a schematic diagram of a second perspective structure of the display panel according to the second embodiment of the disclosure is shown in FIG. 5. It should be noted that the first perspective structure shown in FIG. 4 depicts the relative configuration of the thin film transistor, data line, scan line, pixel electrode and other elements of the display panel. The second perspective structure shown in FIG. 5 depicts the relative position of the elements such as the color resistance unit and the light shielding layer of the display panel.

The display panel comprises a plurality of pixel units which are disposed in the display panel in an array. It should be noted that the pixel units are the smallest repeating units in the display panel, and the display function of the display panel is realized by the cooperative light emission of the plurality of pixel units. Each of the pixel units is a partial region on the display panel. A backlight unit, a data line, a scan line, a thin film transistor, a pixel electrode, a liquid crystal, a color resistance unit, etc. required for realizing the light emission of the pixel unit are disposed on the partial region.

Each of the pixel units includes a first sub-pixel 11, a second sub-pixel 12, and a third sub-pixel 13 disposed between adjacent two of the scan lines (for example, a first scan line S1 and a second scan line S2 in FIG. 4). The first sub-pixel 11 includes a first color resistance unit C1. The first color resistance unit C1 is one of a red color resistance, a green color resistance, and a blue color resistance. The first color resistance unit C1 is configured for realizing the color light emission of the first sub-pixel 11. The second sub-pixel 12 includes a second color resistance unit C2, and the second color resistance unit C2 is one of a red color resistance, a green color resistance, and a blue color resistance. The second color resistance unit C2 is different from the first color resistance unit C1, and the second color resistance unit C2 is configured to realize the color light emission of the second sub-pixel 12. The third sub-pixel 13 includes a third color resistance unit C3, and the third color resistance unit C3 is one of a red color resistance, a green color resistance, and a blue color resistance. The third color resistance unit C3 is different from the first color resistance unit C1 and the second color resistance unit C2, and the third color resistance unit C3 is configured to realize the color light emission of the third sub-pixel 13.

In each of the pixel units, the first sub-pixel 11 and the second sub-pixel 12 are arranged along the first direction X, and the first sub-pixel 11 and the third sub-pixel 13 are arranged along the second direction Y. Optionally, the first direction X and the second direction Y are two directions perpendicular to each other. In this embodiment, the sequence of the first sub-pixel 11 and the second sub-pixel 12 arranged along the first direction X is not limited. The first sub-pixel 11 and the second sub-pixel 12 may be sequentially arranged along the first direction X, or the second sub-pixel 12 and the first sub-pixel 11 may be sequentially arranged along the first direction X. Similarly, in this embodiment, the sequence of the first sub-pixel 11 and the third sub-pixel 13 along the second direction Y is not limited.

In this embodiment, by arranging the first sub-pixel 11 and the second sub-pixel 12 along the first direction X, and arranging the first sub-pixel 11 and the third sub-pixel 13 along the second direction Y different from the first direction X, the number of sub-pixels arranged along the first direction X in the pixel unit is reduced, which is advantageous to reduce the width of each pixel unit along the first direction X and to improve the arrangement of pixel density of the display panel without changing the manufacturing process. Moreover, since the number of sub-pixels arranged along the first direction X is reduced, the width of the entire pixel unit can be reduced while the width of a single sub-pixel is increased, which is beneficial to reduce the requirements for the display panel manufacturing capability, improve the yield of the display panel, and reduce the costs.

Furthermore, the display panel further includes a plurality of scan lines extending in the first direction X and a plurality of data lines extending in the second direction Y. The data line and the scan line are arranged alternately. The data line is configured for providing the data signal, and the scan line is configured for providing the scan signal. The data lines comprise a first data line D1, a second data line D2, and a third data line D3 that are sequentially adjacent, and the scan lines comprise a first scan line S1 and a second scan line S2 that are adjacent to each other. The first sub-pixel 11, the second sub-pixel 12, and the third sub-pixel 13 are all disposed between the first scan line S1 and the second scan line S2. The first sub-pixel 11 and the third sub-pixel 13 are both disposed between the first data line D1 and the second data line D2, and the second sub-pixel 12 is disposed between the second data line D2 and the third data line D3.

Furthermore, the first color resistance unit C1, the second color resistance unit C2, and the third color resistance unit C3 are all disposed between the first scan line S1 and the second scan line S2, the first color resistance unit C1 and the third color resistance unit C3 are both disposed between the first data line D1 and the second data line D2, and the second color resistance unit C2 is disposed between the second data line D2 and the third data line D3.

The first sub-pixel 11 comprises a first pixel electrode P1, and the first pixel electrode P1 is correspondingly arranged with the first color resistance unit C1. The second sub-pixel 12 comprises a second pixel electrode P2, and the second pixel electrode P2 is arranged corresponding to the second color resistance unit C2. The third sub-pixel 13 comprises a third pixel electrode P3, and the third pixel electrode P3 is arranged corresponding to the third color resist unit C3.

The pixel unit further includes a first region Z1 disposed between the first scan line S1 and the second scan line S2, the first region Z1 and the second sub-pixel 12 are arranged along the second direction Y, and the first region Z1 and the third sub-pixel 13 are arranged along the first direction X.

Furthermore, the first region Z1 is disposed between the second data line D2 and the third data line D3.

Each of the pixel units comprises a third transistor T3, a first end of the third transistor T3 is electrically connected to the data line, and a second end of the third transistor T3 is electrically connected to one of the first pixel electrode 11, the second pixel electrode 12, and the third pixel electrode 13 through a third connection hole H3, and the third connection hole H3 is defined in the first region Z1.

Specifically, the first end of the third transistor T3 is electrically connected to the data line through a sixth connection hole H6, and the second end of the third transistor T3 is electrically connected to the third pixel electrode 13 through the third connection hole H3.

Each of the pixel units further includes a first transistor T1 and a second transistor T2. A first end of the first transistor T1 is electrically connected to the data line through a fourth connection hole H4, and a second end of the first transistor T1 is electrically connected to the first pixel electrode 11 through the first connecting hole H1. A first end of the second transistor T2 is electrically connected to the data line through a fifth connection hole H5, and a second end of the second transistor T2 is electrically connected to the second pixel electrode 12 through a second connection hole H2.

Optionally, the first end and the second end of the first transistor T1 are respectively the source and the drain of the first transistor T1. The first transistor T1 further comprises a gate, and the gate of the first transistor T1 is electrically connected to the first scan line S1. The first end and the second end of the second transistor T2 are the source and the drain of the second transistor T2, respectively. The second transistor T2 further comprises a gate, and the gate of the second transistor T2 is electrically connected to the first scan line S1. The first end and the second end of the third transistor T3 are the source and the drain of the third transistor T3, respectively. The third transistor T3 further comprises a gate, and the gate of the third transistor T3 is electrically connected to the first scan line S1.

Moreover, the first transistor T1, the second transistor T2, and the third transistor T3 are arranged along the first scan line S1, and the second transistor T2 is disposed between the first transistor T1 and the third transistor T3.

The first end of the first transistor T1 is electrically connected to the first data line D1 through the fourth connection hole H4, and the first end of the second transistor T2 is electrically connected to the second data line D2 through the fifth connecting hole H5. The first end of the third transistor T3 is electrically connected to the third data line D3 through the sixth connection hole H6.

Furthermore, the first scan line S1 comprises a first side and a second side opposite to the first side. The first connection hole H1 and the second connection hole H2 are defined on the first side of the first scan line S1, and the third connection hole H3 is defined on the second side of the first scan line S1. The fourth connection hole H4 and the fifth connection hole H5 are defined on the second side of the first scan line S1, and the sixth connection hole H6 is defined on the first side of the first scan line S1.

Furthermore, the display panel further comprises a first light shielding layer B1 arranged between the first sub-pixel 11 and the third sub-pixel 13. One side of the first light shielding layer B1 is connected to the first color resistance unit C1, and the other side of the first light shielding layer B1 is connected to the third color resistance unit C3. The first light shielding layer B1 is configured to shield part of the light emitted by the first sub-pixel 11 and part of the light emitted by the third sub-pixel 13 to prevent the color mixing problem of the first sub-pixel 11 and the third sub-pixel 13.

Figure 6:
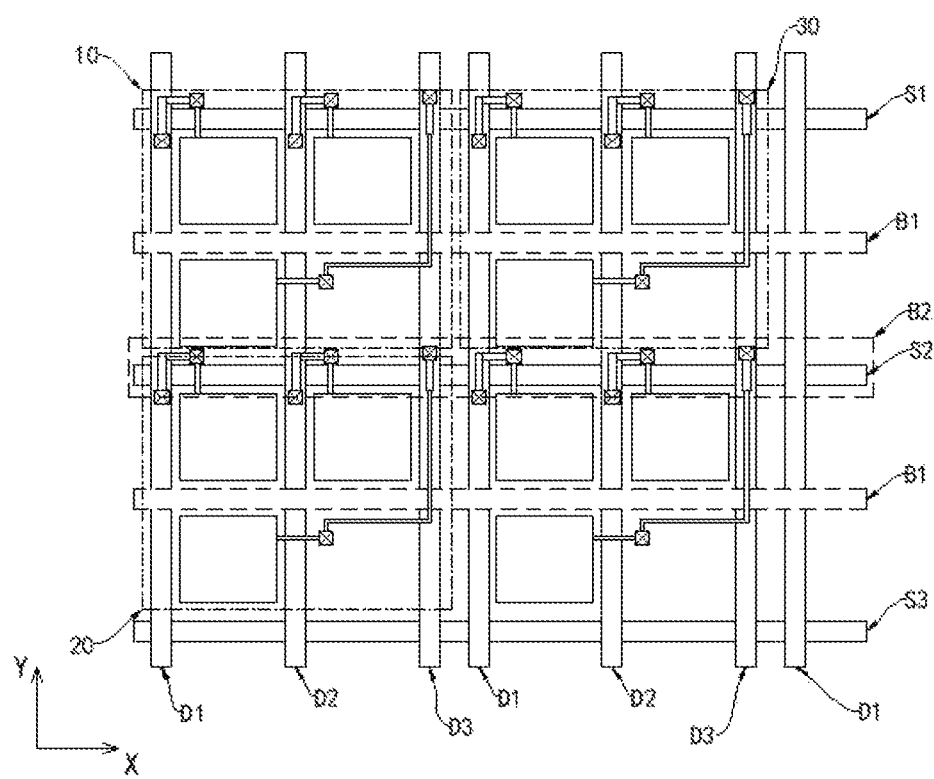
FIG. 6 is a structural schematic diagram of the display panel comprising a plurality of pixel units according to the second embodiment of the disclosure.

Referring to FIG. 4 to FIG. 6, a structural schematic diagram of the display panel comprising a plurality of pixel units according to the second embodiment of the disclosure is shown in FIG. 6. The display panel includes a first pixel unit 10 and a second pixel unit 20 arranged adjacently along the second direction Y. A second light shielding layer B2 is disposed between the first pixel unit 10 and the second pixel unit 20. The second light shielding layer B2 is configured to shield part of the light emitted by the first pixel unit 10 and part of the light emitted by the second pixel unit 20, and prevent the color mixing problem of the first pixel unit 10 and the second pixel unit 20.

Furthermore, the display panel further comprises the first pixel unit 10 and a third pixel unit 30 arranged adjacently along the first direction X. The third data line D3 electrically connected to the first pixel unit 10 is adjacent to the first data line D1 electrically connected to the third pixel unit 30, and there is no sub-pixel between them.

It should be noted that FIG. 6 shows the first scan line S1, the second scan line S2, and the third scan line S3 that are arranged adjacent to each other in the second direction Y.

With respect to the second pixel unit 20, the second scan line S2 and the third scan line S3 are respectively equivalent to the first scan line and the second scan line of the second pixel unit 20, so as to comply with the description of the above embodiment of the disclosure.

Furthermore, the first transistor T1, the second transistor T2 and the third transistor T3 are all disposed between the first pixel unit 10 and the second pixel unit 20. The second light shielding layer B2 is further configured to shield the first transistor T1, the second transistor T2, and the third transistor T3 to prevent the metal structure in each thin film transistor from affecting the display effect of the display panel due to light reflection.

Optionally, each of the first light shielding layer B1 and the second light shielding layer B2 comprises a strip structure extending along the first direction X, and the display panel includes a plurality of the first light shielding layer B1 and a plurality of the second light shielding layers B2.

As mentioned above, in this embodiment, by arranging a plurality of sub-pixels in each pixel unit along two different directions, the number of the sub-pixels arranged in one of the directions is reduced. It is advantageous to reduce the width of each pixel unit and to improve the pixel density of the display panel without changing the manufacturing process. Moreover, as the number of the sub-pixels arranged in one direction is reduced, the width of the entire pixel unit can be reduced while the width of a single sub-pixel is increased, which is beneficial to reduce the requirements for the display panel manufacturing capability, improve the yield of the display panel, and reduce the costs. In this disclosure, a position for defining a connection hole between the thin film transistor and the pixel electrode in the pixel unit is adjusted, and at least one connection hole is defined in the first region. This is beneficial to increase the aperture ratio of the display panel.

Figure 7:
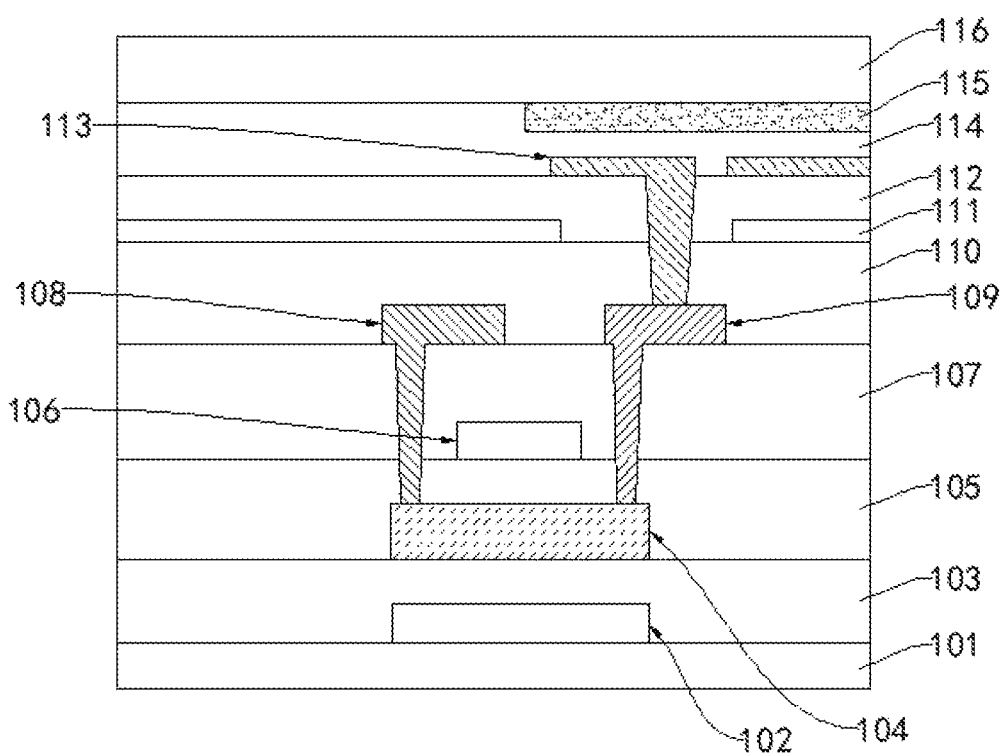
FIG. 7 is a cross-sectional structural schematic diagram of the display panel according to the embodiment of the disclosure.

In one embodiment of the disclosure, referring to FIG. 7, a cross-sectional structural schematic diagram of the display panel according to the embodiment of the disclosure is shown in FIG. 7. The display panel comprises a first substrate 101, a shielding layer 102 disposed on the first substrate 101, a buffer layer 103 covering the shielding layer 102, a semiconductor layer 104 disposed on the buffer layer 103, a gate insulating layer 105 covering the semiconductor layer 104, a gate 106 disposed on the gate insulating layer 105, an interlayer insulating layer 107 covering the gate 106, a source electrode 108 and a drain electrode 109 disposed on the interlayer insulating layer 107, a planarization layer 110 covering the source electrode 108 and the drain electrode 109, a common electrode 111 disposed on the planarization layer 110, a passivation layer 112 covering the common electrode 111, a pixel electrode 113 disposed on the passivation layer 112, a liquid crystal layer 114 disposed on the passivation layer 112, a color resistance layer 115 disposed on the liquid crystal layer 114, and a second substrate 116 disposed on the color resistance layer 115.

The shielding layer 102 is used to prevent light from being emitted from the first substrate 101 to the semiconductor layer 104. The source electrode 108 may be equivalent to the first end of the first transistor T1 or the first end of the second transistor T2 or the first end of the third transistor T3 shown in FIG. 1 or FIG. 4. The drain electrode 109 can be equivalent to the second end of the first transistor T1 or the second end of the second transistor T2 or the second end of the third transistor T3 as shown in FIG. 1 or FIG. 4. The pixel electrode 113 may be equivalent to the first pixel electrode P1 or the second pixel electrode P2 or the third pixel electrode P3 shown in FIG. 1 or FIG. 4. The color resistance layer 115 may be equivalent to the first color resistance unit C1 or the second color resistance unit C2 or the third color resistance unit C3 shown in FIG. 2 or FIG. 5.

The semiconductor layer 104, the gate 106, the source electrode 108, and the drain electrode 109 constitute a thin film transistor, which is equivalent to the first transistor T1 or the second transistor T2 or the third transistor T3 shown in FIG. 1 or FIG. 4.

The liquid crystal layer 114 comprises liquid crystals, and the liquid crystals are deflected at various angles under the action of the cross electric field provided by the common electrode 111 and the pixel electrodes 113, so that the display panel exhibits different gray scales.

The display panel further includes a black matrix disposed in the same layer as or adjacent to the color resist layer 115, and the black matrix includes the first light-shielding layer B1 and the second light-shielding layer B2 shown in any one of FIG. 1 to FIG. 6.

Moreover, the display panel further includes a backlight module, and the backlight module is disposed on a side of the first base substrate 101 away from the shielding layer 102. The backlight module is used to provide backlight for the display panel.

An embodiment of the disclosure further provides a display device. The display device includes the display panel provided in the embodiment of the disclosure. The display device may be a notebook, a tablet, a mobile phone, a computer monitor, a television, a navigator, and other instruments with the function of displaying.

This disclosure has been described with preferred embodiments thereof, and it is understood that many changes and modifications to the described embodiment can be carried out without departing from the scope and the spirit of the invention that is intended to be limited only by the appended claims.

What is claimed is:

1. A display panel, comprising: a plurality of scan lines extending in a first direction, a plurality of data lines extending in a second direction, and a plurality of pixel units, wherein each of the pixel units comprises a first sub-pixel, a second sub-pixel, a third sub-pixel and a first region disposed between two adjacent ones of the scan lines;
wherein the first sub-pixel and the second sub-pixel are arranged along the first direction, the first sub-pixel and the third sub-pixel are arranged along the second direction, the first region and the second sub-pixel are arranged along the second direction, and the first region and the third sub-pixel are arranged along the first direction;
the first sub-pixel comprises a first pixel electrode, the second sub-pixel comprises a second pixel electrode, and the third sub-pixel comprises a third pixel electrode; and
the each of the pixel units further comprises a third transistor having a first terminal electrically connected to one of the data lines and a second terminal electrically connected to one of the first pixel electrode, the second pixel electrode and the third pixel electrode through a third connection hole located in the first region.

2. The display panel according to claim 1, wherein the second terminal of the third transistor is electrically connected to the third pixel electrode through the third connection hole.

3. The display panel according to claim 2, wherein each of the pixel units further comprises a first transistor and a second transistor, a second terminal of the first transistor is electrically connected to the first pixel electrode through a first connection hole, and a second terminal of the second transistor is electrically connected to the second pixel electrode through a second connection hole.

4. The display panel according to claim 3, wherein the first transistor, the second transistor, and the third transistor are arranged along a first one of the scan lines;
wherein the first connection hole and the second connection hole are provided on a first side of the first one of the scan lines; and
wherein the third connection hole is provided on a second side of the first one of the scan lines opposite to the first side of the first one of the scan lines.

5. The display panel according to claim 4, wherein the first transistor comprises a gate electrically connected to the first one of the scan lines;
the second transistor comprises a gate electrically connected to the first one of the scan lines; and
the third transistor comprises a gate electrically connected to the first one of the scan lines.

6. The display panel according to claim 4, wherein the display panel further comprises a second one of the scan lines adjacent to the first one of the scan lines, and the first sub-pixel, the second sub-pixel and the third sub-pixel are all disposed between the first one of the scan lines and the second one of the scan lines.

7. The display panel according to claim 4, wherein the third transistor is disposed between the first transistor and the second transistor.

8. The display panel according to claim 7, wherein a first terminal of the first transistor is electrically connected to a first one of the data lines through a fourth connection hole, the first terminal of the third transistor is electrically connected to a second one of the data fine lines through a sixth connection hole, and a first terminal of the second transistor is electrically connected to a third one of the data lines through a fifth connection hole;
the fourth connection hole and the fifth connection hole are provided on the second side of the first one of the scan lines; and
the sixth connection hole is provided on the first side of the first one of the scan lines.

9. The display panel according to claim 4, wherein the second transistor is disposed between the first transistor and the third transistor.

10. The display panel according to claim 9, wherein a first terminal of the first transistor is electrically connected to a first one of the data lines through a fourth connection hole, a first terminal of the second transistor is electrically connected to a second one of the data lines through a fifth connection hole, and the first terminal of the third transistor is electrically connected to a third one of the data lines through a sixth connection hole;
the fourth connection hole and the fifth connection hole are provided on the second side of the first one of the scan lines; and
the sixth connection hole is provided on the first side of the first one of the scan lines.

11. The display panel according to claim 1, wherein the first sub-pixel comprises a first color resistance unit, the second sub-pixel comprises a second color resistance unit, and the third sub-pixel comprises a third color resistance unit; and
the first color resistance unit and the third color resistance unit are both disposed between a first one of the data lines and a second one of the data lines, and the second color resistance unit is disposed between the second one of the data lines and a third one of the data lines.

12. The display panel according to claim 11, wherein the first region is disposed between the second one of the data lines and the third one of the data lines.

13. The display panel according to claim 11, further comprising a first light shielding layer provided between the first sub-pixel and the third sub-pixel.

14. The display panel according to claim 13, wherein a side of the first light shielding layer is connected to the first color resistance unit, and an other side of the first light shielding layer is connected to the third color resistance unit.

15. The display panel according to claim 3, wherein the plurality of pixel units comprise a first pixel unit and a second pixel unit, the first pixel unit and the second pixel unit are arranged along the second direction, and the display panel further comprises a second light shielding layer provided between the first pixel unit and the second pixel unit.

16. The display panel according to claim 15, wherein each of the first transistor, the second transistor, and the third transistor is shielded by the second light shielding layer.

17. A display device, comprising: a display panel according to claim 1.

18. A display device, comprising: a display panel, wherein the display panel comprises a plurality of scan lines extending in a first direction, a plurality of data lines extending in a second direction, and a plurality of pixel units, wherein each of the pixel units comprises a first sub-pixel, a second sub-pixel, a third sub-pixel, and a first region disposed between two adjacent ones of the scan lines;
  wherein the first sub-pixel and the second sub-pixel are arranged along the first direction;
  wherein the first sub-pixel and the third sub-pixel are arranged along the second direction;
  wherein the first region and the second sub-pixel are arranged along the second direction;
  wherein the first region and the third sub-pixel are arranged along the first direction; and
  wherein the third sub-pixel comprises a third pixel electrode, the each of the pixel units further comprises a third transistor having a second terminal electrically connected to the third pixel electrode through a third connection hole located in the first region.

* * * * *